(12) United States Patent
Shin (10) Patent No.: US 7,342,559 B2
(45) Date of Patent: Mar. 11, 2008

(54) DEMULTIPLEXER USING CURRENT SAMPLE/HOLD CIRCUIT, AND DISPLAY DEVICE USING THE SAME

(75) Inventor: Dong-Yong Shin, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 626 days.

(21) Appl. No.: 10/953,012

(22) Filed: Sep. 28, 2004

(65) Prior Publication Data

US 2005/0099370 A1    May 12, 2005

(30) Foreign Application Priority Data

Nov. 10, 2003  (KR) ...................... 10-2003-0079089

(51) Int. Cl.
*G09G 3/30* (2006.01)
(52) U.S. Cl. .......................................... 345/76; 345/98
(58) Field of Classification Search .......... 345/76–100, 345/104
See application file for complete search history.

(56) References Cited

U.S. PATENT DOCUMENTS

| | | | | |
|---|---|---|---|---|
| 6,333,729 B1 * | 12/2001 | Ha | ............................. | 345/98 |
| 6,847,346 B2 * | 1/2005 | Kumagai et al. | ............. | 345/98 |
| 7,030,844 B2 * | 4/2006 | Kang et al. | ................... | 345/87 |
| 7,057,589 B2 * | 6/2006 | Shin et al. | ..................... | 345/82 |
| 7,205,972 B1 * | 4/2007 | Kyeong et al. | ............... | 345/98 |

\* cited by examiner

*Primary Examiner*—Richard Hjerpe
*Assistant Examiner*—Jean Lesperance
(74) *Attorney, Agent, or Firm*—Christie, Parker & Hale, LLP (57) ABSTRACT

A demultiplexer using sample/hold circuits, and a display device using the same. The demultiplexer includes a first sample/hold circuit group with first and second sample/hold circuits for sampling the data current according to a first sampling order during a first interval, and programming the current corresponding to the sampled and stored data to at least two signal lines during a second interval. The demultiplexer further includes a second sample/hold circuit group with third and fourth sample/hold circuits for sampling the data current according to a second sampling order during a second interval, and programming the current corresponding to the sampled and stored data to the signal lines during a third interval. The first and second sampling orders in even the even frames are different from the sampling orders in the odd frames.

33 Claims, 8 Drawing Sheets

DEMULTIPLEXER USING CURRENT SAMPLE/HOLD CIRCUIT, AND DISPLAY DEVICE USING THE SAME

CROSS REFERENCE TO RELATED APPLICATION

This application claims priority to and the benefit of Korean Patent Application No. 10-2003-0079089 filed on Nov. 10, 2003 in the Korean Intellectual Property Office, the entire content of which is incorporated herein by reference.

BACKGROUND OF THE INVENTION (a) Field of the Invention

The present invention relates to a display device. More specifically, the present invention relates to a demultiplex device and method for demultiplexing data current in a display device.

(b) Description of the Related Art

Figure 1:
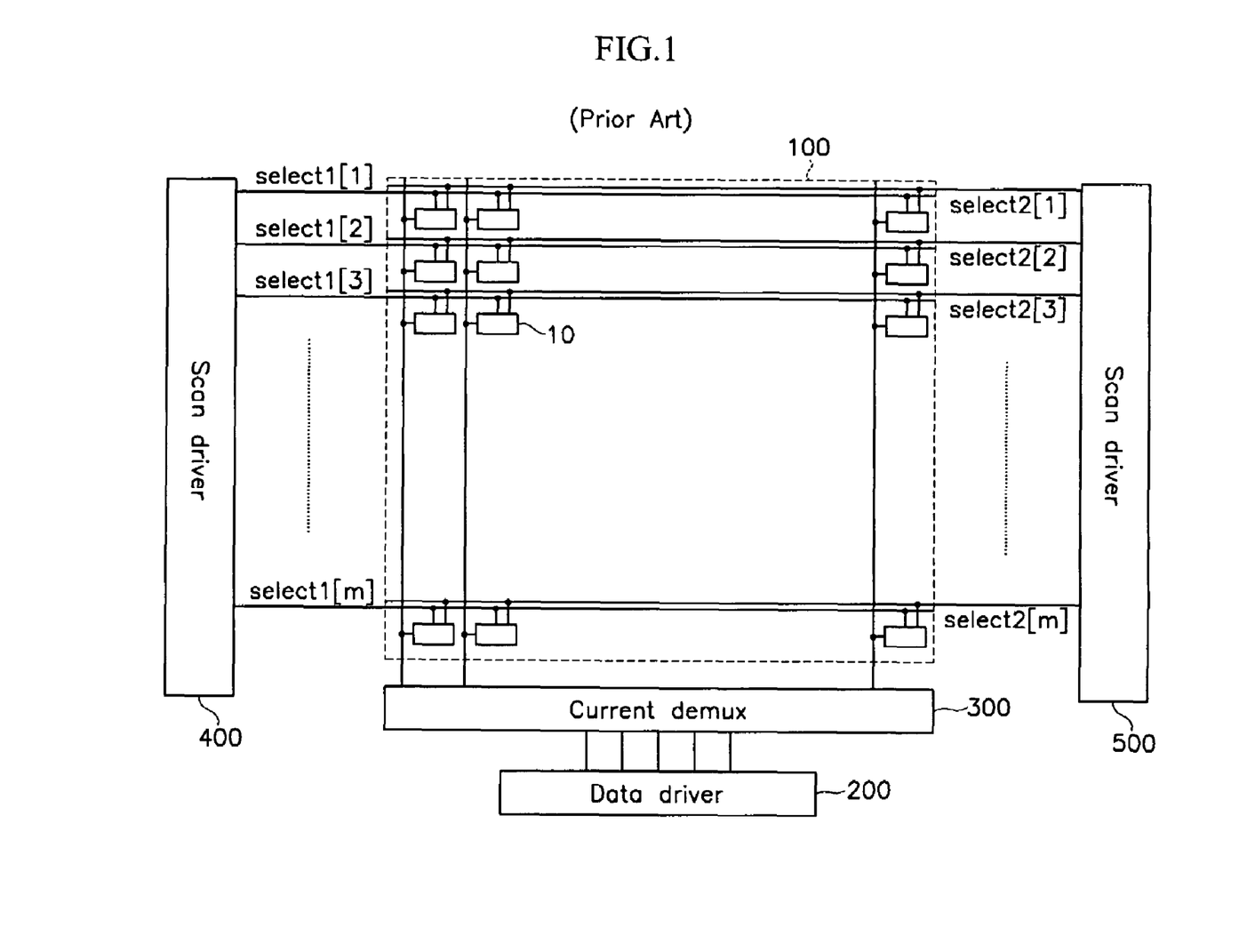
FIG. 1 shows a conventional AMOLED display device for which current demultiplexing is desirable.

FIG. 1 shows an active matrix organic light emitting diode (AMOLED) display device as an example of a current-driven display device for which current demultiplexing is desirable.

The illustrated current-driven display device includes organic electroluminescent (EL) display panel 100, data driver 200, current demultiplexer 300, and scan drivers 400, 500.

A predetermined data current is applied to pixels 10 belonging to scan lines selected by scan drivers 400, 500, and pixels 10 display colors corresponding to the data current. Current demultiplexer unit 300 is used to reduce the number of integrated circuits (ICs) of data driver 200. That is, the current provided by data driver 200 is demultiplexed 1:N by demultiplexer unit 300, and is applied to the pixels corresponding to the N data lines. Usage of demultiplexer unit 300 reduces the number of ICs used for the data driver and helps save purchase costs.

Figure 2:
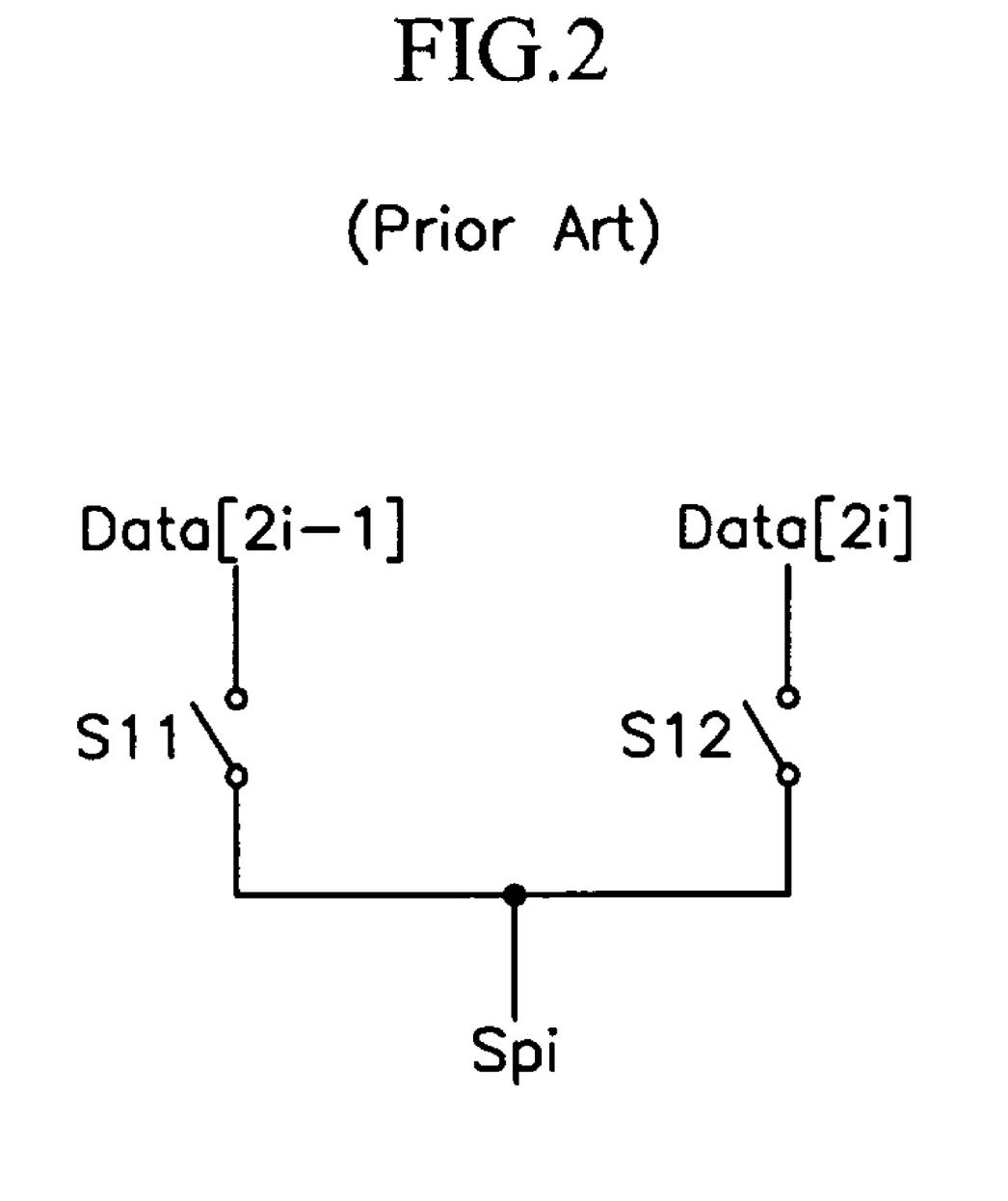
FIG. 2 shows a conventional analog switch for a demultiplexer.

FIG. 2 shows a conventional analog switch for a demultiplexer. The 1:2 demultiplexer shown in FIG. 2 includes switches S11, S12 which are alternately switched to output the data current to two data lines. A long time is generally required to program the data to pixels 10 in order to realize high resolution in the current-driven panel. However, a reduction of the number of ICs of the data driver implies that the data programming time must also be generally reduced. Thus, conventional demultiplexers are not suitable for high-resolution display devices.

SUMMARY OF THE INVENTION

According to one embodiment of the present invention, a demultiplexer is provided which reduces the number of ICs of a data driver without reducing the data programming time.

According to another embodiment of the present invention, a demultiplexer is provided which provides substantially the same current to the data lines.

According to still another embodiment of the present invention, a display device is provided which cancels vertical stripes displayed on a display panel.

According to one embodiment, the present invention is directed to a display device including data driver for transmitting a data current corresponding to an image signal over a plurality of data lines, and a demultiplexer unit including first and second circuit groups. The demultiplexer unit includes an input terminal coupled to the data driver and an output terminal coupled to at least two of the plurality of data lines. The display device further includes a scan driver for supplying a selection signal to a plurality of scan lines.

The first circuit group includes first and second circuits for sampling the data current in a first predetermined order during a first interval, and programming the current corresponding to the sampled and stored data to at least two data lines during a second interval. The second circuit group includes third and fourth circuits for sampling the data current in a second predetermined order during the second interval, and for programming the current corresponding to the sampled and stored data to the data lines during a third interval. According to this embodiment, at least one of the first predetermined sampling order of the first circuit group and the second predetermined sampling order of the second circuit group differs from a first frame to a second frame.

According to another embodiment, the present invention is directed to a display device including a data driver for transmitting a data current corresponding to an image signal over a plurality of data lines, and a demultiplex unit including first and second circuit groups. The demultiplexer unit includes an input terminal coupled to the data driver and an output terminal coupled to at least two of the plurality of data lines. The display device further includes a scan driver for supplying a selection signal to a plurality of scan lines.

The first circuit group includes first and second circuits for sampling the data current in a first predetermined order during a first interval, and programming the current corresponding to the sampled and stored data to at least two data lines during a second interval. The second circuit group includes third and fourth circuits for sampling the data current in a second predetermined order which is different from the first predetermined order during the second interval, and for programming the current corresponding to the sampled and stored data to at least two data lines during a third interval. According to this embodiment, the first circuit group performs sampling before the second circuit group in one frame, and the second circuit group performs sampling before the first circuit group in another frame.

According to another embodiment, the present invention is directed to a display device including a data driver for transmitting a data current corresponding to an image signal over a plurality of data lines, and a demultiplexer unit including first and second circuit groups. The demultiplexer unit includes an input terminal coupled to the data driver and an output terminal coupled to at least two of the plurality of data lines. The display device further includes a scan driver for supplying a selection signal to a plurality of scan lines.

The first circuit group includes first and second circuits for sampling the input data current in a first predetermined order during a first interval, and programming the current corresponding to the sampled and stored data to at least two data lines during a second interval. The second circuit group includes third and fourth circuits for sampling the input data current in a second predetermined order during the second interval, and for programming the current corresponding to the sampled and stored data to the data lines during a third interval. According to this embodiment, at least one of the first predetermined sampling order of the first circuit group and the second predetermined sampling order of the second circuit group differs from a first sub-frame to a second sub-frame.

According to another embodiment, the present invention is directed to a display device including a data driver for transmitting a data current corresponding to an image signal over a plurality of data lines, and a demultiplexer unit including first and second circuit groups. The demultiplexer unit includes an input terminal coupled to the data driver and an output terminal coupled to at least two of the plurality of data lines. The display device further includes a scan driver for supplying selection signals to a plurality of scan lines.

The first circuit group includes first and second circuits for sampling the data current in a first predetermined order during a first interval, and programming the current corresponding to the sampled and stored data to at least two data lines during a second interval. The second circuit group includes third and fourth circuits for sampling the data current in a second predetermined order which is different from the first predetermined order during the second interval, and for programming the current corresponding to the sampled and stored data to at least two data lines during the first interval. According to this embodiment, the first circuit group performs sampling before the second circuit group in one subframe, and the second circuit group performs sampling before the first circuit group in another subframe.

According to another embodiment, the present invention is directed to a demultiplexer for demultiplexing a data current and programming the data current to at least two signal lines. The demultiplexer includes a first circuit group including first and second circuits for sampling the data current in a first predetermined order during a first interval, and programming the current corresponding to the sampled and stored data to at least two signal lines during a second interval. The demultiplexer further includes a second circuit group including third and fourth circuits for sampling the data current in a second predetermined order during a second interval, and for programming the current corresponding to the sampled and stored data to the signal lines during the first interval. According to this embodiment, at least one of the first predetermined sampling order of the first circuit group and the second predetermined sampling order of the second circuit group is varied.

According to another embodiment, the present invention is directed to a demultiplexer for demultiplexing a data current and programming the data current to at least two signal lines. The demultiplexer includes a first circuit group including first and second circuits for sampling the data current in a first predetermined order during a first interval, and for programming the current corresponding to the sampled and stored data to at least two signal lines during a second interval. The demultiplexer further includes a second circuit group including third and fourth circuits for sampling the data current in a second predetermined order which is different from the first predetermined order during a second interval, and for programming the current corresponding to the sampled and stored data to the signal lines during the first interval. According to this embodiment, the first circuit group performs sampling before the second circuit group in one frame, and the second circuit group performs sampling before the first circuit group in another frame.

According to another embodiment, the present invention is directed to a display device having a data driver transmitting data current associated with an image, where the display device includes a demultiplexer unit receiving the data current and applying the data current to a plurality of data lines supplying the data current to a plurality of pixels associated with a plurality of scan lines. The demultiplexer includes first, second, third, and fourth circuits where the first and second circuits sample and store during a first interval the data current from the data driver concurrently with the third and fourth circuits supplying a first sampled data current respectively via first and second data lines. Further, the third and fourth circuits sample and store during a second interval the data current from the data driver concurrently with the first and second circuits supplying a second sampled data current via respectively the first and second data lines. According to this embodiment, the first and second circuits sequentially sample and store the data current according to a first sampling order during the first interval, and the third and fourth circuits sequentially sample and store the data current according to a second sampling order during the second interval.

According to one embodiment, the first sampling order is equal to the second sampling order.

According to another embodiment, the first sampling order alternates, from frame to frame, a selection of one of the first and second circuits for initiating the sampling and storing of the data current during the first interval, and the second sampling order alternates, from frame to frame, a selection of one of the third and fourth circuits for initiating the sampling and storing of the data current during the second interval.

According to another embodiment, the first sampling order alternates, from sub-frame to sub-frame, a selection of one of the first and second circuits for initiating the sampling and storing of the data current during the first interval, and the second sampling order alternates, from sub-frame to sub-frame, a selection of one of the third and fourth circuits for initiating the sampling and storing of the data current during the second interval.

According to one embodiment, the first sub-frame is associated with even scan lines of a display frame, and the second sub-frame is associated with odd scan lines of the display frame.

According to another embodiment, the first and third circuits are coupled to the first data line and the second and fourth circuits are coupled to the second data line, and the number of times the first and third circuits are selected for initiating the sampling and storing of the data current according to their respective sampling orders is substantially equal to the number of times the second and fourth circuits are selected for initiating the sampling and storing of the data current according to their respective sampling orders.

BRIEF DESCRIPTION OF THE DRAWINGS

The accompanying drawings, together with the specification, illustrate exemplary embodiments of the invention, and, together with the description, serve to explain the principles of the present invention.

DETAILED DESCRIPTION

Figure 3A:
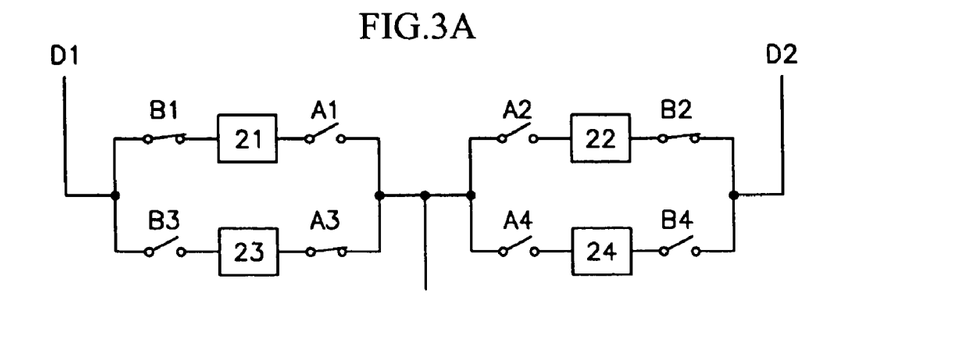
FIGS. 3A to 3D show various demultiplexers in operation according to a first exemplary embodiment of the present invention.
Figure 3B:
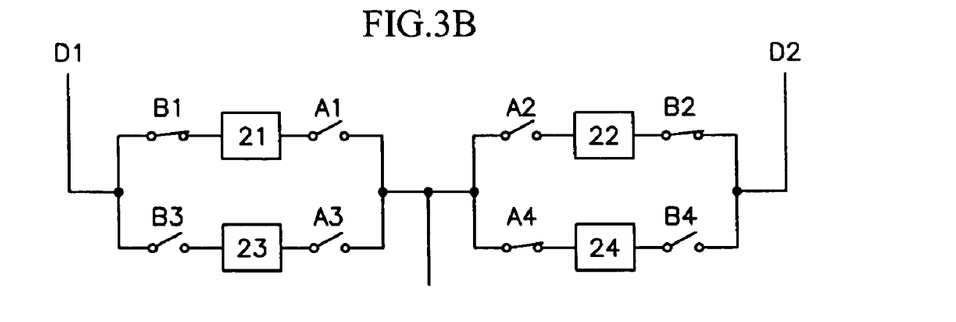
Figure 3C:
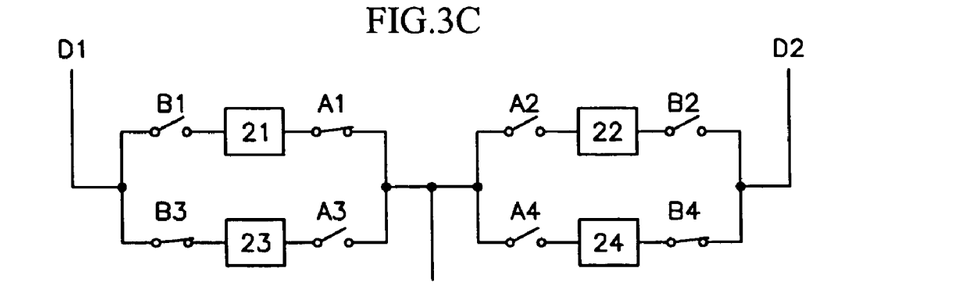
Figure 3D:
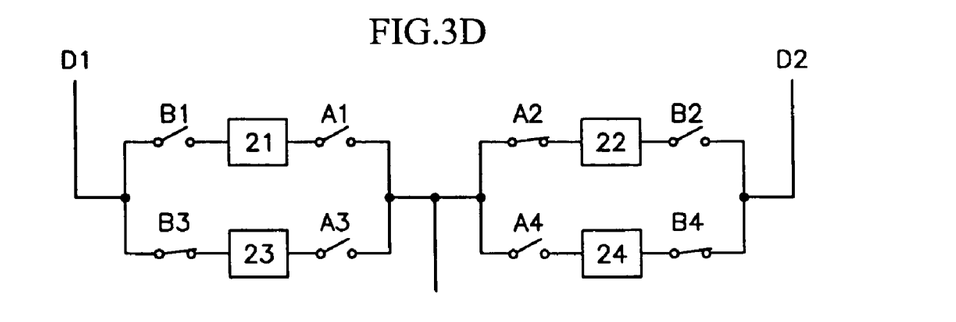

FIGS. 3A and 3B show demultiplexing operations in the case of selecting an odd scan line, and FIGS. 3C and 3D show demultiplexing operations in the case of selecting an even scan line.

The demultiplexers shown in FIGS. 3A to 3D use four sample/hold circuits including data storage elements 21, 22, 23, 24, input switches A1, A2, A3, A4, and output switches B1, B2, B3, B4.

The sample/hold circuits sample the current input from data driver 200 and write the sampled current in the data storage elements in voltage format when input switches A1, A2, A3, A4 are turned on, and hold the current corresponding to the written data through data lines D1, D2 when the output switches B1, B2, B3, B4 are turned on.

The operation of the demultiplexer according to a first exemplary embodiment will now be described.

Referring to FIG. 3A, output switches B1, B2 are turned on, and data storage elements 21, and 22 supply the current corresponding to the previously sampled and stored data to data lines D1, D2. This programs the data to the pixels of the selected odd scan lines. Input switch A3 is turned on, and data storage element 23 performs sampling. In this instance, data storage element 24 enters the standby mode while input switch A4 and output switch B4 are turned off.

Referring to FIG. 3B, output switches B1, B2 are still turned on, and data storage elements 21, 22 consecutively supply the current to data lines D1, D2. Input switch A3 is turned off, and data storage element 23 enters the standby mode and maintains the sampled and stored data. Also, input switch A4 is turned on, and data storage element 24 performs sampling.

When data storage elements 23, 24 finish sampling, as shown in FIG. 3C, output switches B3, B4 are turned on, and data storage elements 23, 24 supply the current corresponding to the sampled and stored data to data lines D1, D2. This programs the data to the pixels of the selected even scan lines. In this instance, the output switches B1, B2 are turned off, input switch A1 is turned on, and data storage element 21 performs sampling.

Referring to FIG. 3D, output switches B3, B4 are still turned on, and the data is consecutively programmed. Input switch A1 is turned off, and data storage element 21 enters the standby mode. Input switch A2 is turned on, and data storage element 22 performs sampling.

According to the demultiplexing method shown in FIGS. 3A to 3D, the pixels are programmed with data without having to reduce data programming time during demultiplexing.

A person of skill in the art should recognize that the above-operated 1:2 demultiplexer may be easily extended to a 1:N demultiplexer.

According to one embodiment of the invention, the sample/hold operation shown in FIGS. 3A to 3D includes a sampling state for sampling the current flowing through the input terminal and writing it in data storage elements 21, 22, 23, 24 in the voltage format, a standby state for maintaining the written data and standing-by when the input switches and the output switches are turned off, and a holding state for supplying the current to the data lines based on the values corresponding to the written data.

Figure 4:
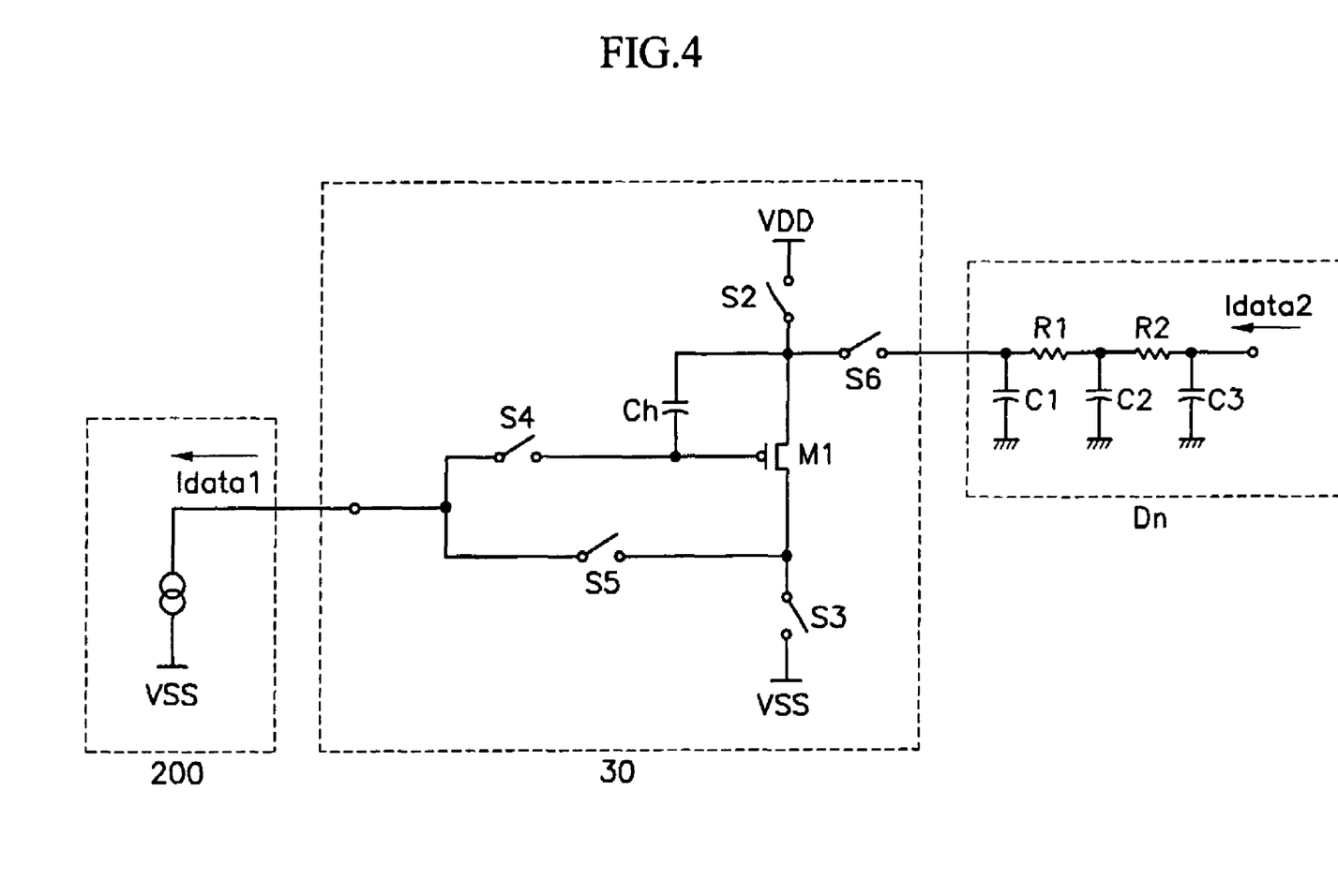
FIG. 4 shows an internal configuration of a current sample/hold circuit according to one exemplary embodiment of the present invention.
Figure 5A:
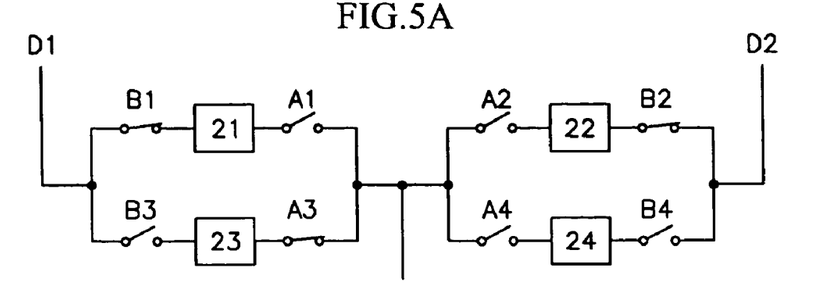
FIGS. 5A to 5D show a 1:2 demultiplexer operating in an odd frame according to a second exemplary embodiment of the present invention.
Figure 5B:
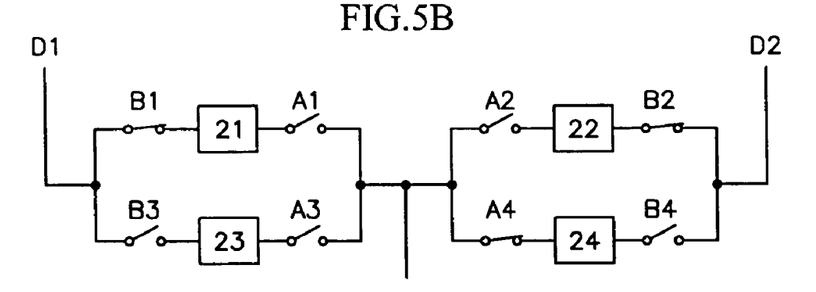
Figure 5C:
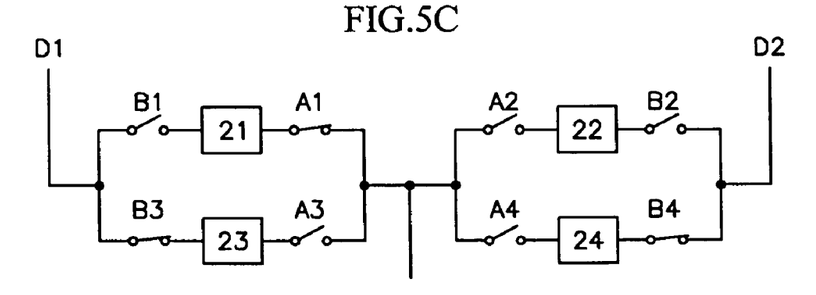
Figure 5D:
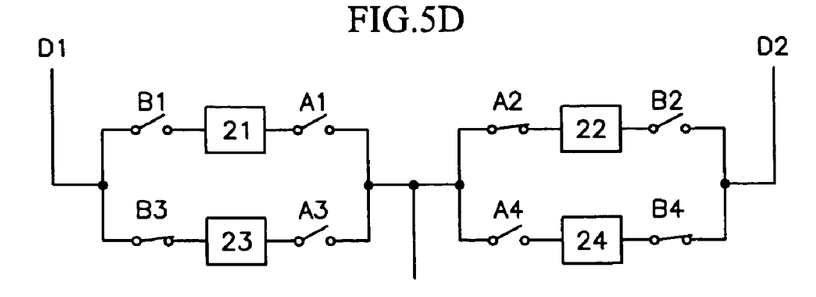

FIG. 4 shows an internal configuration of the sample/hold circuit according to the first exemplary embodiment of the present invention.

The sample/hold circuit 30 includes a data storage element and input and output switches coupled between data driver 200 and data line Dn. Also, data line Dn has parasitic resistance components R1, R2 and parasitic capacitance components C1, C2, C3.

The data storage element includes transistor M1 and capacitor Ch, the input switch includes switches S2, S4, S5, and the output switch includes switches S3, S6.

In the illustrated sample/hold circuit 30, input switch S2 is coupled between power source VDD and a source of transistor M1, and output switch S3 is coupled between power source VSS and a drain of transistor M1. According to one embodiment, transistor M1 is a positive-channel metal oxide semiconductor (PMOS) transistor, and power source VDD has a voltage greater than that of power source VSS. A person of skill in the art should recognize, however, that other configurations are possible, and the present invention is not restricted to the configuration shown in FIG. 4. For example, according to another embodiment, transistor M1 may be a negative-channel metal oxide semiconductor (NMOS), and power source VDD may have a voltage that is less than that of power source VSS.

Input switch S4 is coupled between a gate of transistor M1 and data driver 200, and input switch S5 is coupled between the drain of transistor M1 and data driver 200. Therefore, when input switches S4, S5 are turned on, transistor M1 is diode-connected.

According to an exemplary operation of the sample/hold circuit 30, when input switches S2, S4, S5 are turned on and output switches S3, S6 are turned off, the drain and gate of transistor M1 are coupled so that transistor M1 is diode-connected, and the current is passed through transistor M1 and flows to data driver 200 from power source VDD. In this instance, capacitor Ch is charged with the gate-source voltage corresponding to the current flowing to transistor M1, and the sample/hold circuit 30 performs a sampling operation.

When switches S2, S3, S4, S5, S6 are turned off, the sample/hold circuit 30 enters the standby state while another sample/hold circuit of the demultiplexer holds the data to the data line.

When input switches S2, S4, S5 are turned off and output switches S3, S6 are turned on, the current corresponding to the gate-source voltage charged in capacitor Ch is maintained at the output terminal. In this instance, the sample/hold circuit 30 programs the data, and holds the data through the data line.

A person of skill in the art should recognize that the present invention is not limited to a demultiplexer unit with the sample/hold circuit illustrated in FIG. 4 or to any other specific sample/hold circuit, but may extend to other types of demultiplexer units which perform subsequent demultiplexing via a sample/hold circuit.

The demultiplexer according to the one exemplary embodiment increases the data programming time when two sample/hold circuits sample the data current from the data driver while two residual sample/hold circuits hold the data through the data line. However, when the demultiplexer according to this exemplary embodiment is used, vertical stripes may appear on the display panel. This is generally caused by a difference of currents applied to the data lines, that is, via a phenomenon which generates a difference of the holding current values when the current is sampled on two different occasions.

In this regard, since input switch A3 is turned off in advance of input switch A4, and input switch A1 is turned off in advance of input switch A2 in all frames, the sample/hold circuit coupled to data line D1 performs sampling before the sample/hold circuit coupled to data line D2 performs its sampling, creating the difference between the current held through data line D1 and the data held through data line D2.

Second and third embodiments of the invention address this issue by causing the average of sampling orders by the four sample/hold circuits to be substantially the same. This is achieved, according to one embodiment, by dividing the frames into even frames and odd frames, and providing sampling orders of the sample/hold circuits in the even frames that are different from the sampling orders in the odd frames.

FIGS. 5A to 6D show operations of a 1:2 demultiplexer unit according to the second exemplary embodiment of the present invention. FIGS. 5A to 5D show a 1:2 demultiplexing operation in the odd frame, and FIGS. 6A to 6D show a 1:2 demultiplexing operation in the even frame. Also, FIGS. 5A, 5B, 6A, and 6B show the demultiplexing operation in the case of selecting the odd scan line, and FIGS. 5C, 5D, 6C, and 6D show the demultiplexing operation in the case of selecting the even scan line.

The operation of the demultiplexer unit according to the second exemplary embodiment will now be described. The demultiplexing operation in the even frame will be described since the demultiplexing operation in the odd frame has already been described with respect to FIGS. 5A to 5D corresponding to that of the first exemplary embodiment.

Figure 6A:
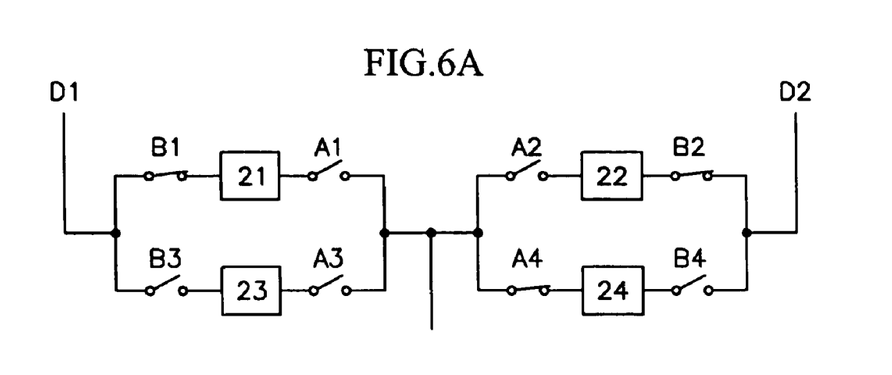
FIGS. 6A to 6D show a 1:2 demultiplexer operating in an even frame according to a second exemplary embodiment of the present invention.

Referring to FIG. 6A, output switches B1 and B2 are turned on, data storage elements 21, 22 supply the current according to the previously sampled and stored data to data lines D1, D2 to program the data to the pixel of the selected odd scan line. Input switch A4 is turned on, and data storage element 24 performs sampling. In this instance, data storage element 23 with the turned-off input switch A3 and output switch B3 stays in the standby state.

Figure 6B:
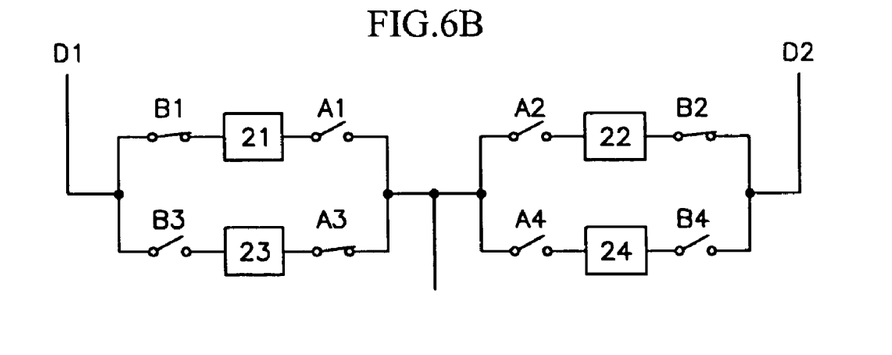

Referring to FIG. 6B, output switches B1, B2 are still turned on, and data storage elements 21, 22 consecutively supply the current to data line D1, D2. Also, input switch A4 is turned off, and data storage element 24 goes to the standby state to maintain the sampled and stored data. When input switch A3 is turned on, data storage element 23 performs sampling.

Figure 6C:
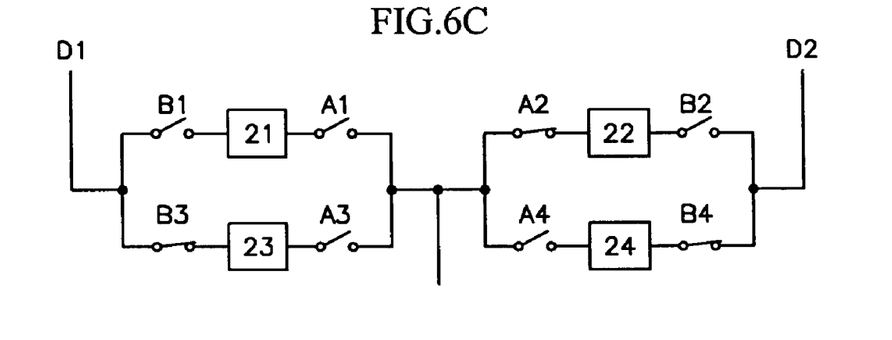

When data storage elements 23, 24 finish sampling, output switches B3, B4 are turned on as shown in FIG. 6C, and data storage elements 23, 24 supply the current according to the sampled and stored data to data lines D1, D2 to program the data to the pixels of the selected even scan line. Input switch A2 is turned on, and data storage element 22 performs sampling.

Figure 6D:
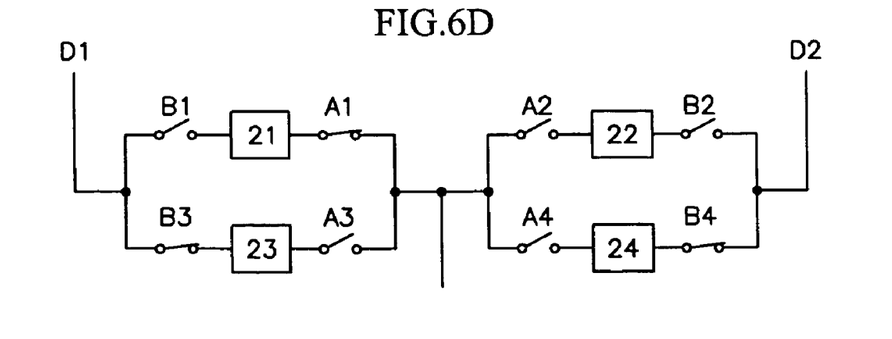
Figure 7A:
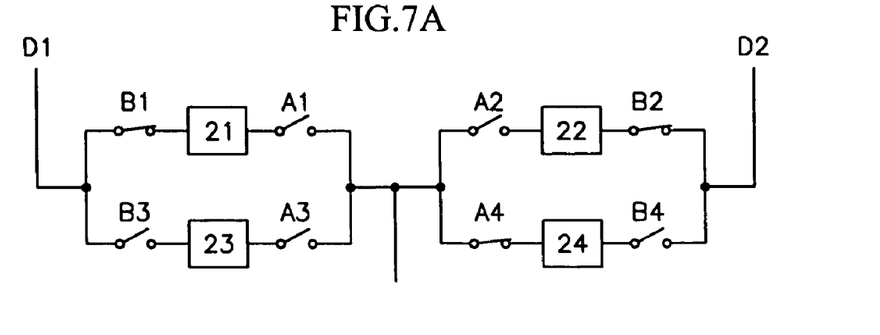
FIGS. 7A to 7D show a 1:2 demultiplexer operating in an odd frame according to a third exemplary embodiment of the present invention.
Figure 7B:
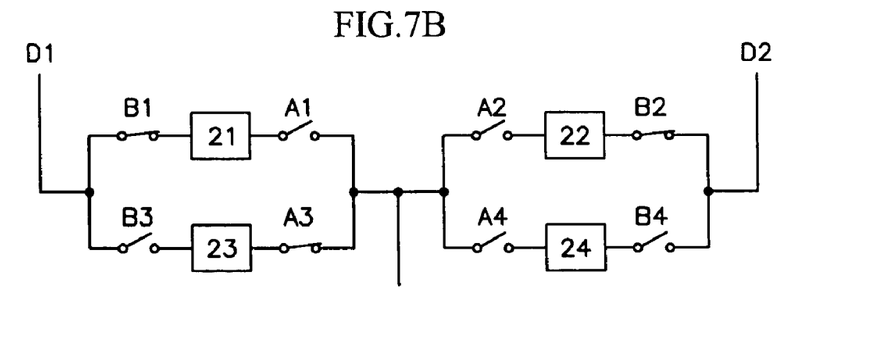
Figure 7C:
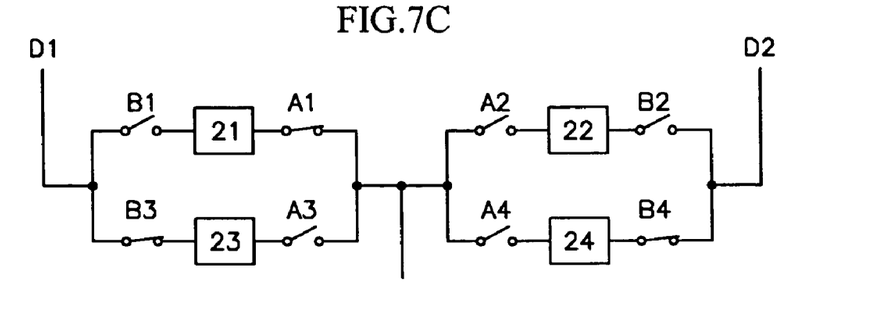
Figure 7D:
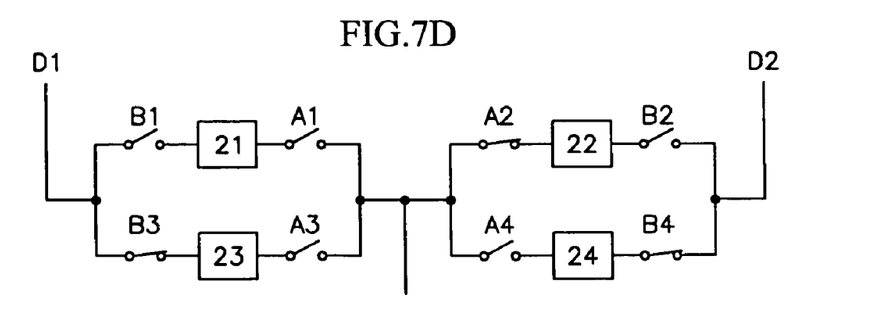
Figure 8A:
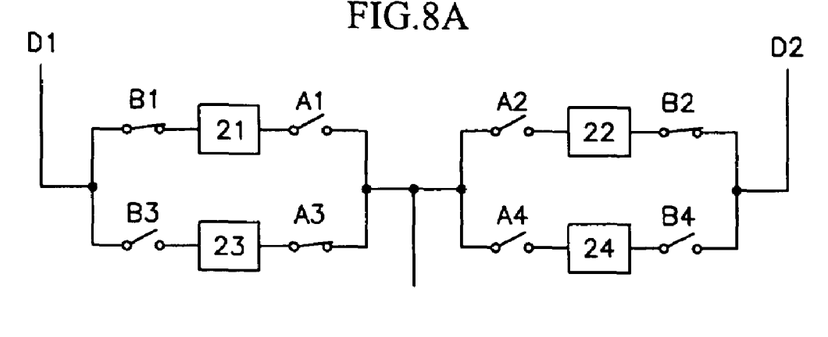
FIGS. 8A to 8D show a 1:2 demultiplexer operating in an even frame according to a third exemplary embodiment of the present invention.
Figure 8B:
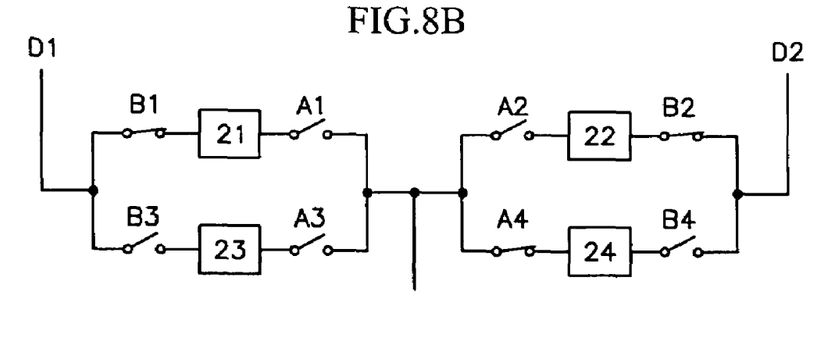
Figure 8C:
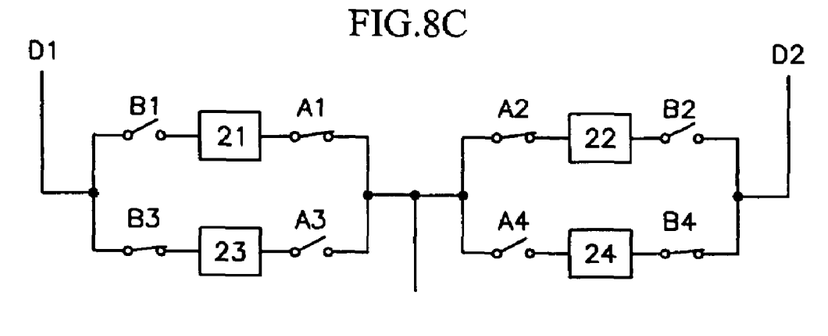
Figure 8D:
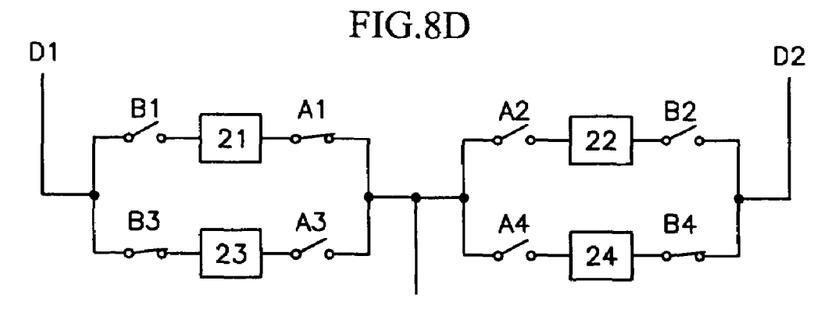

Referring to FIG. 6D, output switches B3, B4 are still turned on, and the data is consecutively programmed. Input switch A2 is turned off so that data storage element 22 enters the standby state, and input switch A1 is turned on so that data storage element 21 performs sampling.

The sampling orders in the odd frames and the even frames are therefore differently established in the demultiplexing operation according to the second embodiment. That is, data storage elements 23, 21 on the side of data line D1 perform sampling first, and data storage elements 24, 22 on the side of data line D2 perform sampling afterwards in the odd scan lines and even scan lines in the odd frames. Data storage elements 24, 22 on the side of data line D2 perform sampling first, and data storage elements 23, 21 on the side of data line D1 perform sampling afterwards in the odd scan lines and even scan lines in the even frames.

As described, when the frames are divided into odd and even frames, and the sampling orders become different, the sampling orders of the first to fourth sample/hold circuits average out to be the same. Therefore, on average, the same current is applied to the data lines, helping to eliminate the vertical stripes generated on the display panel due to a difference of data currents.

FIGS. 7A to 8D show a 1:2 demultiplexer in operation according to a third exemplary embodiment of the present invention.

FIGS. 7A to 7D show a 1:2 demultiplexing operation in the odd frame, and FIGS. 8A to 8D show a 1:2 demultiplexing operation in the even frame. Further, FIGS. 7A, 7B, 8A, and 8B show a demultiplexing operation in the case of selecting the odd scan line, and FIGS. 7C, 7D, 8C, and 8D show a demultiplexing operation in the case of selecting the even scan line.

Regarding the demultiplexing operation in the odd frame as shown in FIGS. 7A to 7D, data storage element 24 performs sampling first, followed by sampling of the data storage element 23 while the odd scan line is selected and data storage elements 21, 22 hold the current. When the even scan line is selected, data storage elements 23, 24 hold the current, data storage element 21 performs sampling first followed by sampling of data storage element 22.

Regarding the demultiplexing operation in the even frame as shown in FIGS. 8A to 8D, data storage element 23 performs sampling first followed by sampling of data storage element 24 while the odd scan line is selected and data storage elements 21, 22 hold the current. When the even scan line is selected, data storage elements 23, 24 hold the current, data storage element 22 performs sampling first, followed by sampling of data storage element 21.

Accordingly, on average, the same current is applied to the data line by providing different sampling orders in the odd and even frames, allowing time for programming the data to the pixels since the sampling operation is performed when the data is programmed. Therefore, there is no need to reduce the data programming time during demultiplexing.

In the above-described embodiment, the sampling orders have been made different in the odd frame and the even frame in order to generate different sampling orders of the current applied to data lines D1, D2. Furthermore, at least two sample/hold circuit groups having different sampling orders may be provided, and different orders of the sample/hold circuit groups may be generated in the odd and even frames.

In this regard, when a first sample/hold circuit group in which data storage element 21 coupled to data line D1 performs sampling and data storage element 22 coupled to data line D2 performs sampling afterwards, and a second sample/hold circuit group in which data storage element 24 coupled to data line D2 performs sampling and data storage element 23 coupled to data line D1 performs sampling, and the operational orders of the first and second sample/hold circuit groups are modified in the odd and even frames, the resultant average current values applied to the data lines are substantially the same.

In addition, the sampling orders of the odd and even frames in the second and third exemplary embodiments may be changed, and the even and odd scan lines may be respectively divided into subframes or fields, and then be driven.

In this regard, the odd scan line is established to be driven in the odd subframe, the even scan line is established to be driven in the even subframe, and the data corresponding to the respective scan lines are established to be provided through the above-described demultiplexing method.

Also, the frames or the subframes may be divided to even and odd frames or subframes, and then driven. A person of skill in the art should recognize that other classification methods for applying average data current to the data lines may also be employed.

While this invention has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a data driver for transmitting data current corresponding to an image signal over a plurality of data lines;
    a demultiplexer unit including first and second circuit groups, the demultiplexer unit having an input terminal coupled to the data driver and an output terminal coupled to at least two of the plurality of data lines; and
    a scan driver for supplying a selection signal to a plurality of scan lines, wherein
    the first circuit group includes first and second circuits for sampling the data current in a first predetermined order during a first interval, and programming the current corresponding to the sampled and stored data to at least two data lines during a second interval, and wherein
    the second circuit group includes third and fourth circuits for sampling the data current in a second predetermined order during the second interval, and for programming the current corresponding to the sampled and stored data to the data lines during a third interval, and wherein
    at least one of the first predetermined sampling order of the first circuit group and the second predetermined sampling order of the second circuit group differs from a first frame to a second frame.

2. The display device of claim 1, wherein the third interval substantially corresponds to the first interval.

3. The display device of claim 1, wherein the first interval is a time period when odd scan lines are selected from the plurality of scan lines, and the second interval is a time period when even scan lines are selected from the plurality of scan lines.

4. The display device of claim 1, wherein the demultiplexer unit performs sampling ordered from the first circuit to the second circuit during the first interval, and performs sampling ordered from the third circuit to the fourth circuit during the second interval, in a single frame.

5. The display device of claim 4, wherein the demultiplexer unit performs sampling ordered from the second circuit to the first circuit during the first interval, and performs sampling ordered from the fourth circuit to the third circuit during the second interval, in another single frame.

6. The display device of claim 1, wherein the demultiplexer unit performs sampling ordered from the first circuit to the second circuit during the first interval, and performs sampling ordered from the fourth circuit to the third circuit during the second interval, in a single frame.

7. The display device of claim 6, wherein the demultiplexer unit performs sampling ordered from the second circuit to the first circuit during the first interval, and performs sampling ordered from the third circuit to the fourth circuit during the second interval, in another single frame.

8. The display device of claim 1, wherein average sampling orders assigned to the first to fourth circuits are substantially the same.

9. The display device of claim 1, wherein the first to fourth circuits each comprise:
    a first transistor;
    a first switch coupled to the first transistor for diode-connecting the first transistor responsive to a first control signal;
    a capacitor coupled between a source and a gate of the first transistor;
    a second switch for inputting data to a drain of the first transistor responsive to the first control signal; and
    a third switch for outputting data to the source of the first transistor responsive to a second control signal and a voltage charged in the capacitor.

10. The display device of claim 9, wherein the first to fourth circuits each further comprise:
    a fourth switch for coupling the source of the first transistor and a first power source responsive to a third control signal; and
    a fifth switch for coupling the drain of the first transistor and a second power source responsive to a fourth control signal.

11. The display device of claim 9, wherein the first transistor is a positive channel metal oxide semi conductor transistor, and the first power has a voltage which is greater than that of the second power.

12. The display device of claim 9, wherein the first transistor is a transistor, and the first power has a voltage which is less than that of the second power.

13. A display device comprising:
    a data driver for transmitting a data current corresponding to an image signal over a plurality of data lines;
    a demultiplexer unit including first and second circuit groups, the demultiplexer unit having an input terminal coupled to the data driver and an output terminal coupled to at least two of the plurality of data lines; and
    a scan driver for supplying a selection signal to the plurality of scan lines, wherein
    the first circuit group includes first and second circuits for sampling the data current in a first predetermined order during a first interval, and programming the current corresponding to the sampled and stored data to at least two data lines during a second interval, and wherein
    the second circuit group includes third and fourth circuits for sampling the data current in a second predetermined order which is different from the first predetermined order during the second interval, and for programming the current corresponding to the sampled and stored data to at least two data lines during a third interval, and wherein
    the first circuit group performs sampling before the second circuit group in one frame, and the second circuit group performs sampling before the first circuit group in another frame.

14. The display device of claim 13, wherein the third interval substantially corresponds to the first interval.

15. The display device of claim 13, wherein the first interval is a time period when odd scan lines are selected from the plurality of scan lines, and the second interval is a time period when even scan lines are selected from the plurality of scan lines.

16. The display device of claim 13, wherein average sampling orders assigned to the first to fourth circuits are substantially the same.

17. A display device comprising:
a data driver for transmitting a data current corresponding to an image signal over a plurality of data lines;
a demultiplexer unit including first and second circuit groups, the demultiplexer unit having an input terminal coupled to the data driver and an output terminal coupled to at least two of the plurality of data lines; and
a scan driver supplying a selection signal to a plurality of scan lines, wherein
the first circuit group includes first and second circuits for sampling the input data current in a first predetermined order during a first interval, and programming the current corresponding to the sampled and stored data to at least two data lines during a second interval, and wherein
the second circuit group includes third and fourth circuits for sampling the input data current in a second predetermined order during the second interval, and for programming the current corresponding to the sampled and stored data to the data lines during a third interval, and wherein
at least one of the first predetermined sampling order of the first circuit group and the second predetermined sampling order of the second circuit group differs from a first sub-frame to a second sub-frame.

18. The display device of claim 17, wherein the third interval substantially corresponds to the first interval.

19. The display device of claim 18, wherein the first interval is a time period when odd scan lines are selected from the plurality of scan lines, and the second interval is a time period when even scan lines are selected from the plurality of scan lines.

20. The display device of claim 18, wherein the demultiplexer unit performs sampling ordered from the first circuit to the second circuit during the first interval, and performs sampling ordered from the third circuit to the fourth circuit during the second interval, in a single subframe.

21. The display device of claim 20, wherein the demultiplexer unit performs sampling ordered from the second circuit to the first circuit during the first interval, and performs sampling ordered from the fourth circuit to the third circuit during the second interval, in another single subframe.

22. The display device of claim 18, wherein the demultiplexer unit performs sampling ordered from the first circuit to the second circuit during the first interval, and performs sampling ordered from the fourth circuit to the third circuit during the second interval, in a single subframe.

23. The display device of claim 22, wherein the demultiplexer unit allows sampling ordered from the second circuit to the first circuit during the first interval, and allows sampling ordered from the third circuit to the fourth circuit during the second interval, in another single subframe.

24. The display device of claim 17, wherein the average sampling orders assigned to the first to fourth circuits are substantially the same.

25. The display device of claim 17, wherein the first to fourth circuits each comprise:
a first transistor;
a first switch coupled to the first transistor for diode-connecting the first transistor responsive to a first control signal;
a capacitor coupled between a source and a gate of the first transistor;
a second switch for inputting data to a drain of the first transistor responsive to the first control signal; and
a third switch for outputting data to the source of the first transistor responsive to a second control signal and a voltage charged in the capacitor.

26. The display device of claim 25, wherein the first to fourth circuits each further comprise:
a fourth switch for coupling the source of the first transistor and a first power source responsive to a third control signal; and
a fifth switch for coupling the drain of the first transistor and a second power source responsive to a fourth control signal.

27. A display device comprising:
a data driver for transmitting a data current corresponding to an image signal over a plurality of data lines;
a demultiplexer unit including first and second circuit groups, the demultiplexer unit having an input terminal coupled to the data driver and an output terminal coupled to at least two of the plurality of data lines; and
a scan driver for supplying a selection signal to a plurality of scan lines, wherein
the first circuit group includes first and second circuits for sampling the data current in a first predetermined order during a first interval, and programming the current corresponding to the sampled and stored data to at least two data lines during a second interval, and wherein
the second circuit group includes third and fourth circuits for sampling the data current in a second predetermined order which is different from the first predetermined order during the second interval, and for programming the current corresponding to the sampled and stored data to at least two data lines during the first interval, and wherein
the first circuit group performs sampling before the second circuit group in one subframe, and the second circuit group performs sampling before the first circuit group in another subframe.

28. A display device having a data driver transmitting data current associated with an image, the display device comprising:
a demultiplexer unit receiving the data current and applying the data current to a plurality of data lines supplying the data current to a plurality of pixels associated with a plurality of scan lines,
wherein, the demultiplexer includes first, second, third, and fourth circuits, the first and second circuits sampling and storing, during a first interval, the data current from the data driver concurrently with the third and fourth circuits supplying a first sampled data current via first and second data lines, the third and fourth circuits sampling and storing, during a second interval, the data current from the data driver concurrently with the first and second circuits supplying a second sampled data current via the first and second data lines, and wherein the first and second circuits sequentially sample and store the data current according to a first sampling order during the first interval, and the third and fourth circuits sequentially sample and store the data current according to a second sampling order during the second interval.

29. The display device of claim 28, wherein the first sampling order is equal to the second sampling order.

30. The display device of claim 28, wherein the first sampling order alternates, from frame to frame, a selection of one of the first and second circuits for initiating the sampling and storing of the data current during the first interval, and the second sampling order alternates, from frame to frame, a selection of one of the third and fourth circuits for initiating the sampling and storing of the data current during the second interval.

31. The display device of claim 28, wherein the first sampling order alternates, from sub-frame to sub-frame, a selection of one of the first and second circuits for initiating the sampling and storing of the data current during the first interval, and the second sampling order alternates, from sub-frame to sub-frame, a selection of one of the third and fourth circuits for initiating the sampling and storing of the data current during the second interval.

32. The display device of claim 31, wherein the first sub-frame is associated with even scan lines of a display frame, and the second sub-frame is associated with odd scan lines of the display frame.

33. The display device of claim 28, wherein the first and third circuits are coupled to the first data line and the second and fourth circuits are coupled to the second data line, wherein a number of times the first and third circuits are selected for initiating the sampling and storing of the data current according to their respective sampling orders is substantially equal to the number of times the second and fourth circuits are selected for initiating the sampling and storing of the data current according to their respective sampling orders.

\* \* \* \* \*